(12) United States Patent
Kondo

(10) Patent No.: US 11,336,262 B2
(45) Date of Patent: May 17, 2022

(54) MULTIPLEXER

(71) Applicant: TAIYO YUDEN CO., LTD., Tokyo (JP)

(72) Inventor: Hiroki Kondo, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 178 days.

(21) Appl. No.: 16/803,482

(22) Filed: Feb. 27, 2020

(65) Prior Publication Data

US 2020/0313651 A1  Oct. 1, 2020

(30) Foreign Application Priority Data

Mar. 26, 2019  (JP) .............................. JP2019-058974

(51) Int. Cl.
*H03H 9/72* (2006.01)
*H03H 9/25* (2006.01)
*H03H 9/02* (2006.01)
*H03H 9/145* (2006.01)
*H03H 9/64* (2006.01)

(52) U.S. Cl.
CPC ........ *H03H 9/725* (2013.01); *H03H 9/02771* (2013.01); *H03H 9/14544* (2013.01); *H03H 9/25* (2013.01); *H03H 9/6406* (2013.01)

(58) Field of Classification Search
CPC .. H03H 9/02771; H03H 9/14544; H03H 9/25; H03H 9/6406; H03H 9/725
See application file for complete search history.

(56) References Cited

U.S. PATENT DOCUMENTS

| 6,900,577 | B2 | 5/2005 | Takamine ................. 310/313 D |
| 6,924,715 | B2 * | 8/2005 | Beaudin ............ H03H 9/14547 330/306 |
| 7,015,776 | B2 | 3/2006 | Takamine ..................... 333/195 |
| 7,116,189 | B2 | 10/2006 | Takamine ..................... 333/195 |
| 7,135,944 | B2 * | 11/2006 | Iwamoto .............. H03H 9/6476 333/133 |
| 7,245,193 | B2 * | 7/2007 | Funasaka ........... H03H 9/02574 333/193 |

(Continued)

FOREIGN PATENT DOCUMENTS

JP  2005-295203 A  10/2005

*Primary Examiner* — Dean O Takaoka
(74) *Attorney, Agent, or Firm* — Stein IP, LLC

(57) ABSTRACT

A multiplexer includes: a first filter connected between a common terminal and a first terminal; and a second filter connected between the common terminal and a second terminal, a passband of the second filter being higher than a passband of the first filter, the second filter including series resonators connected in series and parallel resonators connected in parallel between the common terminal and the second terminal, each of the parallel resonators including a pair of comb-shaped electrodes including electrode fingers and a pair of reflectors sandwiching the pair of comb-shaped electrodes therebetween and including grating bars, PR1>PD1 where PR1 represents an average pitch of the grating bars of a parallel resonator closest to the common terminal among the parallel resonators and PD1 represents an average pitch of the electrode fingers of the parallel resonator closest to the common terminal.

8 Claims, 8 Drawing Sheets

(56) References Cited

U.S. PATENT DOCUMENTS

| | | | |
|---|---|---|---|
| 2013/0147678 A1* | 6/2013 | Taniguchi | H03H 9/706 343/853 |
| 2014/0009247 A1* | 1/2014 | Moriya | H03H 9/725 333/133 |
| 2018/0109238 A1* | 4/2018 | Yamaji | H03H 9/6493 |
| 2019/0238116 A1 | 8/2019 | Takamine | 9/725 |

* cited by examiner

MULTIPLEXER

CROSS-REFERENCE TO RELATED APPLICATION

This application is based upon and claims the benefit of priority of the prior Japanese Patent Application No. 2019-058974, filed on Mar. 26, 2019, the entire contents of which are incorporated herein by reference.

FIELD

A certain aspect of the embodiments relates to a multiplexer.

BACKGROUND

In the surface acoustic wave resonator, reflectors that reflect the acoustic wave excited by an inter digital transducer (IDT) are located at both sides of the IDT. This structure efficiently confines the acoustic wave in the IDT. The stopband in which the reflectors reflect the acoustic wave includes the resonant frequency and the antiresonant frequency of the surface acoustic wave resonator.

In the duplexer having filters that include surface acoustic wave resonators and have different passbands, it has been known to configure the pitch of the reflector to be greater than the pitch of the IDT in the series resonator closest to the common terminal of the filter having a lower passband, as disclosed in, for example, Japanese Patent Application Publication No. 2005-295203 (hereinafter, referred to as Patent Document 1).

SUMMARY OF THE INVENTION

According to a first aspect of the embodiments, there is provided a multiplexer including: a first filter connected between a common terminal and a first terminal; and a second filter connected between the common terminal and a second terminal, a passband of the second filter being higher than a passband of the first filter, the second filter including series resonators connected in series between the common terminal and the second terminal and parallel resonators connected in parallel between the common terminal and the second terminal, each of the parallel resonators including a pair of comb-shaped electrodes and a pair of reflectors, the pair of comb-shaped electrodes including electrode fingers, the pair of reflectors sandwiching the pair of comb-shaped electrodes therebetween and including grating bars, PR1>PD1 where PR1 represents an average pitch of the grating bars of a parallel resonator closest to the common terminal in terms of circuit connection among the parallel resonators and PD1 represents an average pitch of the electrode fingers of the parallel resonator closest to the common terminal in terms of circuit connection.

According to a second aspect of the embodiments, there is provided a multiplexer including: a first filter connected between a common terminal and a first terminal; and a second filter connected between the common terminal and a second terminal, a passband of the second filter being higher than a passband of the first filter, the second filter including series resonators connected in series between the common terminal and the second terminal and parallel resonators connected in parallel between the common terminal and the second terminal, each of the series resonators including a pair of comb-shaped electrodes and a pair of reflectors, the pair of comb-shaped electrodes including electrode fingers, the pair of reflectors sandwiching the pair of comb-shaped electrodes therebetween and including grating bars, $2 \times fas/(f1+f2) \leq SR1/SD1$ where SR1 represents an average pitch of the grating bars of a series resonator closest to the common terminal in terms of circuit connection among the series resonators, SD1 represents an average pitch of the electrode fingers of the series resonator closest to the common terminal in terms of circuit connection, fas represents an antiresonant frequency of the series resonator closest to the common terminal in terms of circuit connection, f1 represents a center frequency of the passband of the first filter, and f2 represents a center frequency of the passband of the second filter.

According to a fourth aspect of the embodiments, there is provided a multiplexer including: a first filter connected between a common terminal and a first terminal; and a second filter connected between the common terminal and a second terminal, a passband of the second filter being higher than a passband of the first filter, the second filter including series resonators connected in series between the common terminal and the second terminal and parallel resonators connected in parallel between the common terminal and the second terminal, each of the series resonators including a pair of comb-shaped electrodes and a pair of reflectors, the pair of comb-shaped electrodes including electrode fingers, the pair of reflectors sandwiching the pair of comb-shaped electrodes therebetween and including grating bars, a stopband of the reflector of a series resonator closest to the common terminal in terms of circuit connection among the series resonators including the passband of the first filter and the passband of the second filter.

DETAILED DESCRIPTION

In Patent Document 1, the high-frequency end of the stopband of the reflector of the series resonator closest to the common terminal of the filter having a lower passband is made to be located outside the passband of the filter having a higher passband. This configuration reduces spurious emissions in the passband.

Patent Document 1 pointed out a rapid variation in impedance at the high-frequency end of the stopband as a problem. However, a variation in impedance at the low-frequency end of the stopband is not described, and improvement in the characteristics of the filter with a lower passband is not described.

Hereinafter, with reference to the accompanying drawings, embodiments will be described.

First Embodiment

Figure 1A:
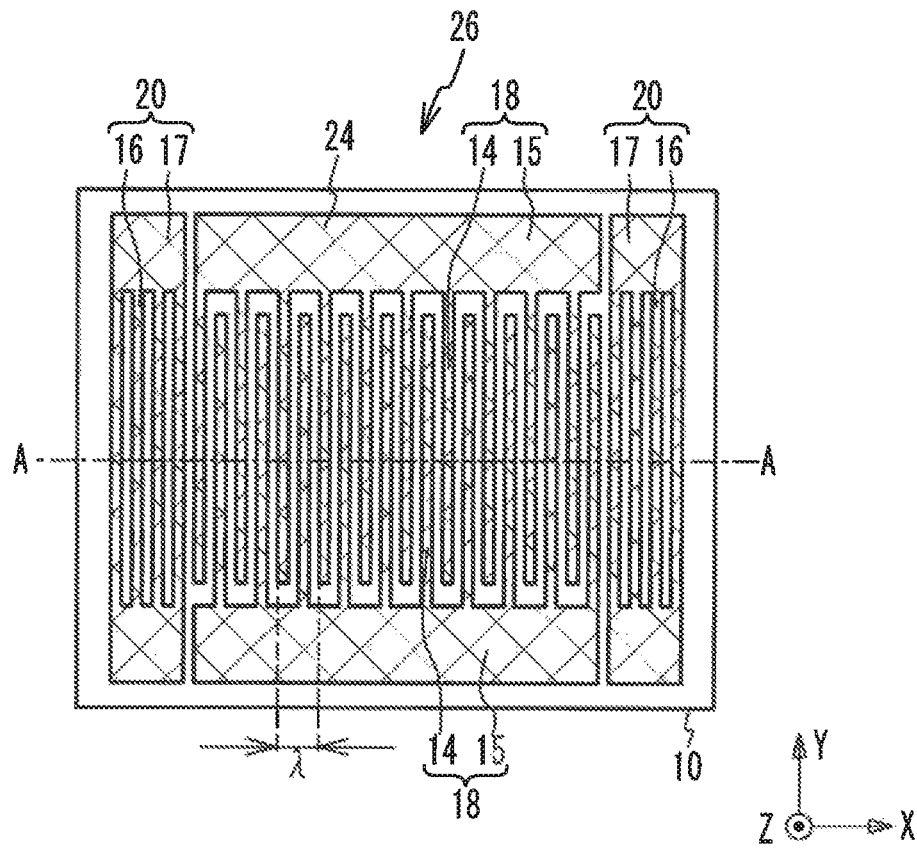
FIG. 1A is a plan view of an acoustic wave resonator in a comparative example and an embodiment.
Figure 1B:
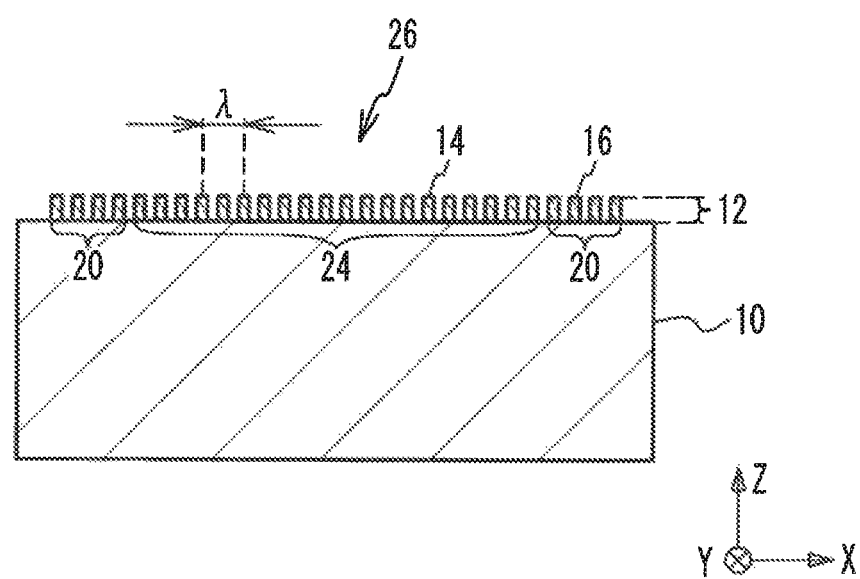
FIG. 1B is a cross-sectional view taken along line A-A in FIG. 1A.

FIG. 1A is a plan view of an acoustic wave resonator in a comparative example and an embodiment, and FIG. 1B is a cross-sectional view taken along line A-A in FIG. 1A. The direction in which electrode fingers are arranged (the arrangement direction of the electrode fingers) is defined as an X direction, the direction in which the electrode fingers extend (the extension direction of the electrode fingers) is defined as a Y direction, and the direction normal to the piezoelectric substrate (the normal direction of the piezoelectric substrate) is defines as a Z direction. The X direction, the Y direction, and the Z direction do not necessarily correspond to the crystal orientations of the piezoelectric substrate. However, when the piezoelectric substrate is a rotated Y-cut X-propagation substrate, the X direction is the X-axis orientation of the crystal orientation.

As illustrated in FIG. 1A and FIG. 1B, in a one-port acoustic wave resonator 26, an IDT 24 and reflectors 20 are formed on a piezoelectric substrate 10. The IDT 24 and the reflectors 20 are formed of a metal film 12 formed on the piezoelectric substrate 10. A pair of the reflectors 20 is located at both sides of the IDT 24 in the X direction to sandwich the IDT 24 therebetween.

The IDT 24 includes a pair of comb-shaped electrodes 18 facing each other. The comb-shaped electrode 18 includes electrode fingers 14 and a bus bar 15 to which the electrode fingers 14 are connected. A pair of the comb-shaped electrodes 18 is provided so as to face each other such that the electrode fingers 14 of one of the comb-shaped electrodes 18 and the electrode fingers 14 of the other of the comb-shaped electrodes 18 are alternately arranged in at least a part of the IDT 24. The reflector 20 includes grating bars 16 and bus bars 17 to which the grating bars 16 are connected.

The acoustic wave excited by the electrode fingers 14 of a pair of the comb-shaped electrodes 18 propagates mainly in the X direction. The pitch of the electrode fingers 14 of one of the comb-shaped electrodes 18 is substantially equal to the wavelength λ of the acoustic wave. In the following description, the pitch of the electrode fingers 14 of one of the comb-shaped electrodes 18 is also referred to as the pitch of the IDT 24. The reflectors 20 reflect the acoustic wave. Thus, the energy of the acoustic wave is confined in the IDT 24.

The piezoelectric substrate 10 is, for example, a lithium tantalate substrate, a lithium niobate substrate, or a crystal substrate, and is, for example, a rotated Y-cut X-propagation lithium tantalate substrate or a lithium niobate substrate. The piezoelectric substrate 10 may be bonded on the upper surface of a support substrate such as, but not limited to, a monocrystalline sapphire substrate, an alumina substrate, a spinel substrate, a crystal substrate, or a silicon substrate. An insulating film such as, but not limited to, a silicon oxide film or an aluminum nitride film may be provided between the piezoelectric substrate 10 and the support substrate. As described above, the piezoelectric substrate 10 may be directly or indirectly bonded on the support substrate.

The metal film 12 is, for example, an aluminum film, a copper film, or a molybdenum film. A metal film such as, but not limited to, a titanium film or a chrome film may be provided between the aluminum film, the copper film, or the molybdenum film and the piezoelectric substrate 10. The wavelength λ is, for example, 500 nm to 5000 nm, the widths in the X direction of the electrode finger 14 and the grating bar 16 are, for example, 200 nm to 3000 nm, the film thickness of the metal film 12 is, for example, 50 nm to 500 nm, and the electrostatic capacitance of the acoustic wave resonator 26 is, for example, 0.1 pF to 10 pF. An insulating film functioning as a protective film or a temperature compensation film may be provided on the piezoelectric substrate 10 so as to cover the metal film 12.

Figure 2:
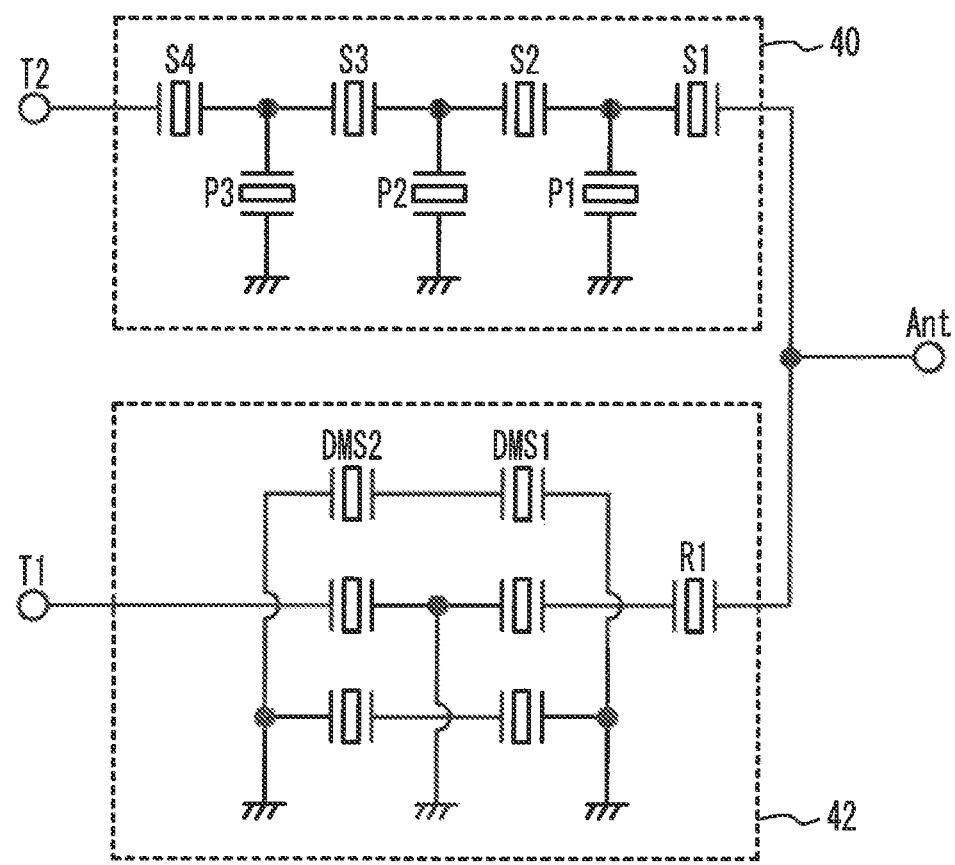
FIG. 2 is a circuit diagram of a multiplexer in accordance with a first embodiment.

FIG. 2 is a circuit diagram of a multiplexer in accordance with a first embodiment. As illustrated in FIG. 2, a filter 42 (a first filter) is connected between a common terminal Ant and a terminal T1 (a first terminal), and a filter 40 (a second filter) is connected between the common terminal Ant and a terminal T2 (a second terminal). The passband of the filter 40 is higher than the passband of the filter 42. The filters 40 and 42 are a receive filter and a transmit filter for the same band of, for example, the frequency division duplex (FDD) communication method, respectively. The filters 40 and 42 may be a transmit filter and a receive filter, respectively. The filters 40 and 42 may be filters for different bands of, for example, the time division duplex (TDD) communication method.

The filter 40 is a ladder-type filter, and includes series resonators S1 to S4 and parallel resonators P1 to P3. The series resonators S1 to S4 are connected in series between the common terminal Ant and the terminal T2, and the parallel resonators P1 to P3 are connected in parallel between the common terminal Ant and the terminal T1.

In the filter 42, double mode surface acoustic wave (DMS) filters DMS1 and DMS2 are cascade-connected between the common terminal Ant and the terminal T1, and an acoustic wave resonator R1 is connected between the filter DMS1 and the common terminal Ant.

Figure 3A:
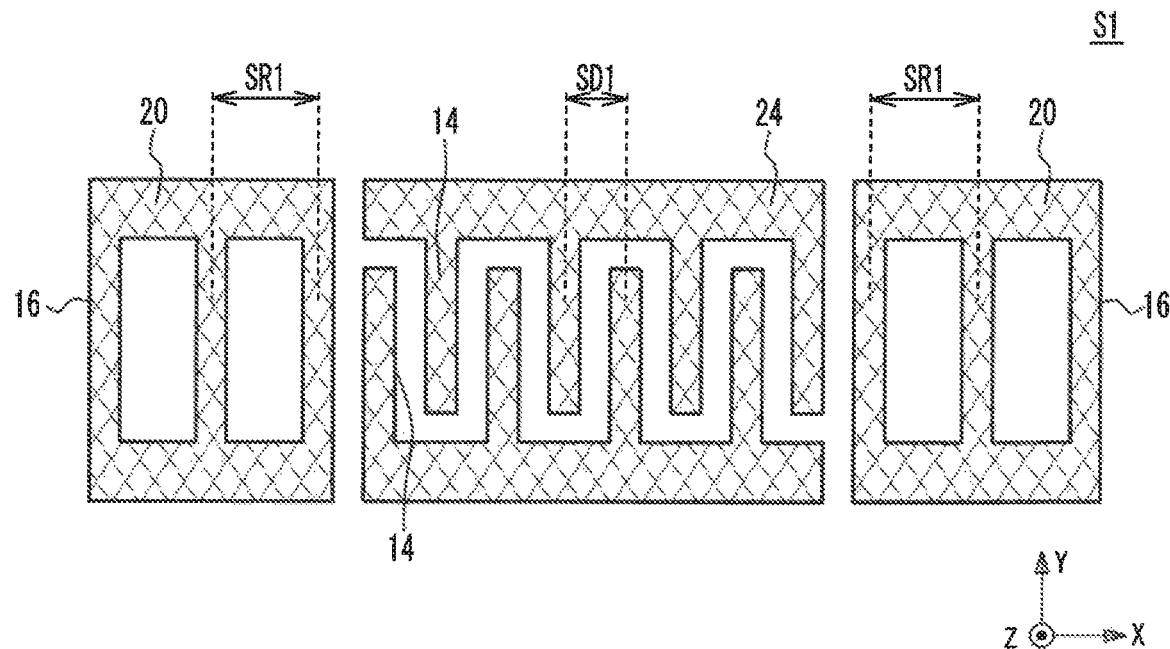
FIG. 3A is a plan view of a series resonator S1 in the first embodiment.
Figure 3B:
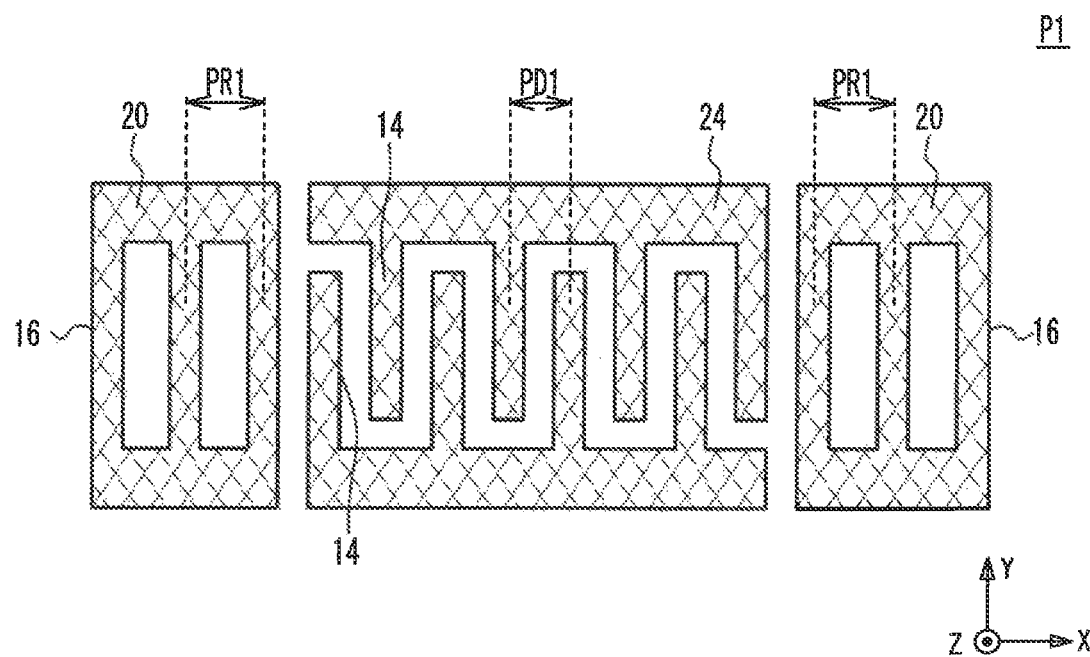
FIG. 3B is a plan view of a parallel resonator P1 in the first embodiment.

FIG. 3A is a plan view of the series resonator S1 in the first embodiment, and FIG. 3B is a plan view of the parallel resonator P1 in the first embodiment. As illustrated in FIG. 3A, in the series resonator S1, the average pitch of the electrode fingers 14 of the IDT 24 is SD1. The wavelength of the acoustic wave excited by the IDT 24 is substantially 2×SD1. The average pitch of the grating bars 16 of the reflector 20 is SR1. As illustrated in FIG. 3B, in the parallel resonator P1, the average pitch of the electrode fingers 14 of the IDT 24 is PD1. The average pitch of the grating bars 16 of the reflector 20 is PR1. SR1 is greater than SD1 (i.e., SR1>SD1), PR1 is greater than PD1 (i.e., PR1>PD1), and SR1/SD1 is greater than PR1/PD1 (i.e., SR1/SD1>PR1/PD1).

Figure 4A:
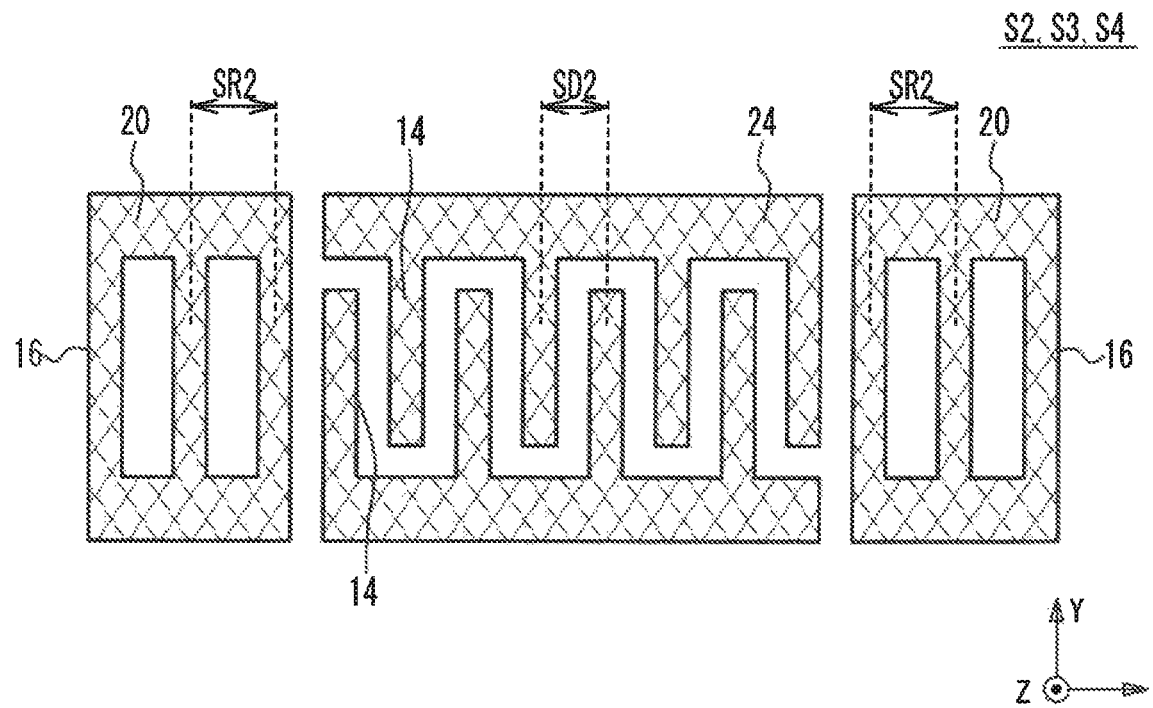
FIG. 4A is a plan view of series resonators S2 to S4 in the first embodiment.
Figure 4B:
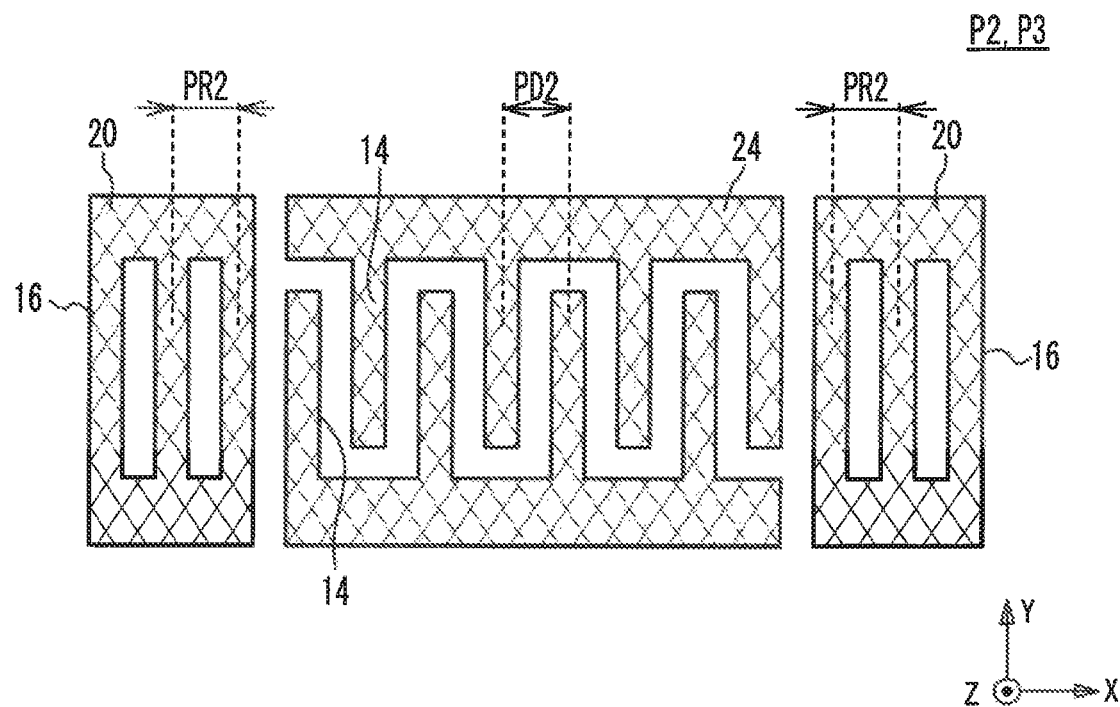
FIG. 4B is a plan view of parallel resonators P2 and P3 in the first embodiment.

FIG. 4A is a plan view of the series resonators S2 to S4 in the first embodiment, and FIG. 4B is a plan view of the parallel resonators P2 and P3 in the first embodiment. As illustrated in FIG. 4A, in the series resonators S2, S3, and S4, the average pitch of the electrode fingers 14 of the IDT 24 is SD2. The average pitch of the grating bars 16 of the reflector 20 is SR2. As illustrated in FIG. 4B, in the parallel resonators P2 and P3, the average pitch of the electrode fingers 14 of the IDT 24 is PD2. The average pitch of the grating bars 16 of the reflector 20 is PR2. SR2 is greater than SD2 (i.e., SR2>SD2), PR2 is substantially equal to PD2, and SR2/SD2 is greater than PR2/PD2 (i.e., SR2/SD2>PR2/PD2).

When the series resonator S1 is compared with the series resonators S2 to S4, SR1/SD1 is greater than SR2/SD2. (i.e., SR1/SD1>SR2/SD2). When the parallel resonator P1 is compared with the parallel resonators P2 and P3, PR1/PD1 is greater than PR2/PD2 (i.e., PR1/PD1>PR2/PD2).

Simulation

Transmission characteristics of the first embodiment and a first comparative example were simulated. The simulation conditions are as follows.

Piezoelectric substrate 10: 42° Y-cut X-propagation lithium tantalate substrate

Metal film 12: Titanium film with a film thickness of 190 nm and an aluminum film with a film thickness of 213 nm stacked in this order from the piezoelectric substrate 10 side Series Resonator S1
    Pitch of the IDT 24 (the pitch of the electrode fingers 14×2): 4.82 μm,
    Number of pairs of the electrode fingers in the IDT 24 ((the number of the electrode fingers 14)/2): 65 pairs
    Number of pairs of the grating bars in the reflector 20 ((the number of the grating bars 16)/2): 15 pairs
    Duty ratio: 52.3%
    Aperture length: 53.98 μm (11.2λ)
    Antiresonant frequency: 836.0 MHz Parallel Resonator P1
    Pitch of the IDT 24 (the pitch of the electrode fingers 14×2): 5.04 μm,
    Number of pairs of the electrode fingers in the IDT 24 ((the number of the electrode fingers 14)/2): 58 pairs
    Number of pairs of the grating bars in the reflector 20 ((the number of the grating bars 16)/2): 15 pairs
    Duty ratio: 52.3%
    Aperture length: 163.8 μm (32.5λ)
    Antiresonant frequency: 803.0 MHz The pitches of the IDTs 24 of the series resonators S2 to S4 are equal to the pitch of the IDT 24 of the series resonator S1, and the pitches of the IDTs 24 of the parallel resonators P2 and P3 are equal to the pitch of the IDT 24 of the parallel resonator P1.

In the first embodiment, the pitch ratio, which is the ratio of the difference between the pitch of the electrode fingers 14 of the IDT 24 and the pitch of the grating bars 16 of the reflector 20 to the pitch of the electrode fingers 14 of the IDT 24, in each resonator is as follows.

Series Resonators
    S1: (SR1−SD1)/SD1×100 [%]: 7.88%
    S2 to S4: (SR2−SD2)/SR2×100 [%]: 3.96%

Parallel Resonators
    P1: (PR1−PD1)/PD1×100 [%]: 3.24%
    P2 and P3: (PR2−PD2)/PR2×100 [%]: 0.00%

In the first comparative example, the pitch ratio, which is the ratio of the difference between the pitch of the electrode fingers 14 of the IDT 24 and the pitch of the grating bars 16 of the reflector 20 to the pitch of the electrode fingers 14 of the IDT 24, in each resonator is as follows.

Series Resonators
    S1 to S4: (SR2−SD2)/SR2×100 [%]: 3.96%

Parallel Resonators
    P1 to P3: (PR2−PD2)/PR2×100 [%]: 0.00%

In the first comparative example, the pitch ratio of the series resonator S1 is made to be equal to the pitch ratios of the series resonators S2 to S4, and the pitch ratio of the parallel resonator P1 is made to be equal to the pitch ratios of the parallel resonators P2 and P3.

The reason why (SR2−SD2)/SR2 is made to be a positive value in the series resonators S2 to S4 is to cause the stopband of the reflector 20 to include the passband of the filter 40.

Figure 5A:
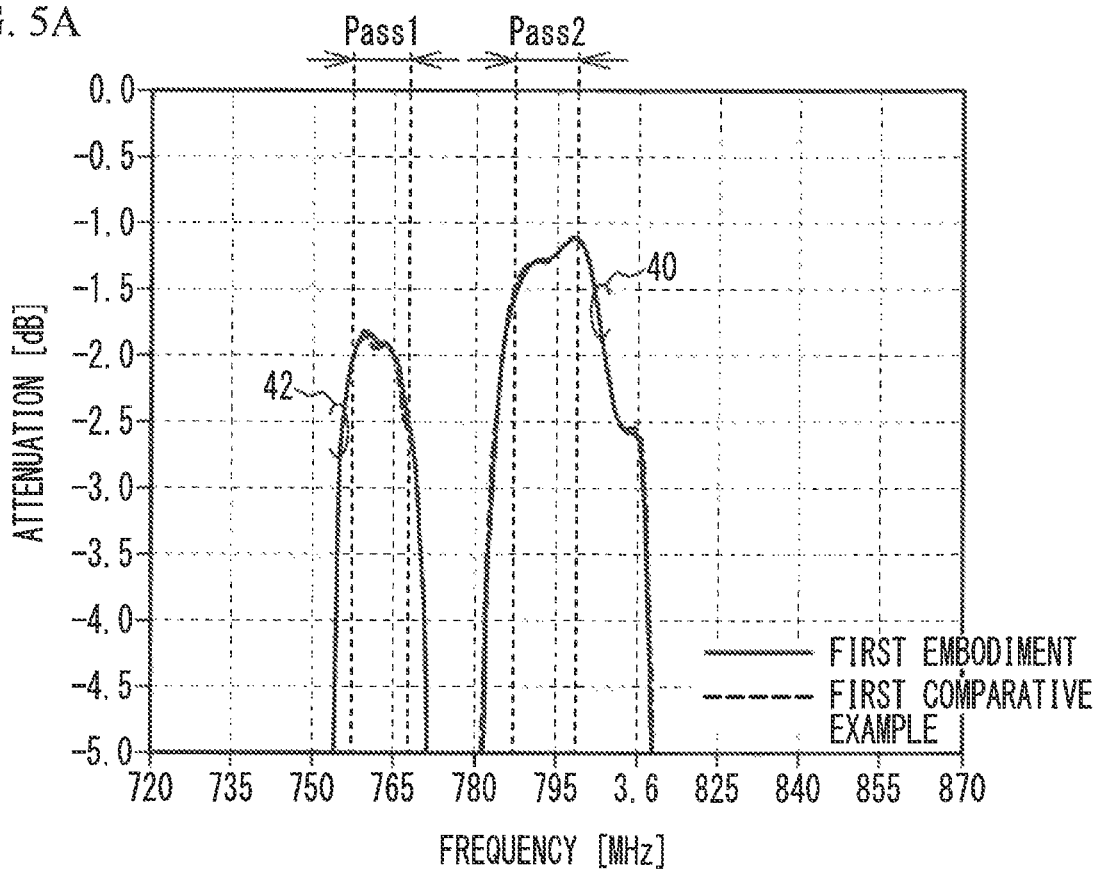
FIG. 5A and FIG. 5B illustrate transmission characteristics of filters 40 and 42 in the first embodiment and a first comparative example.
Figure 5B:
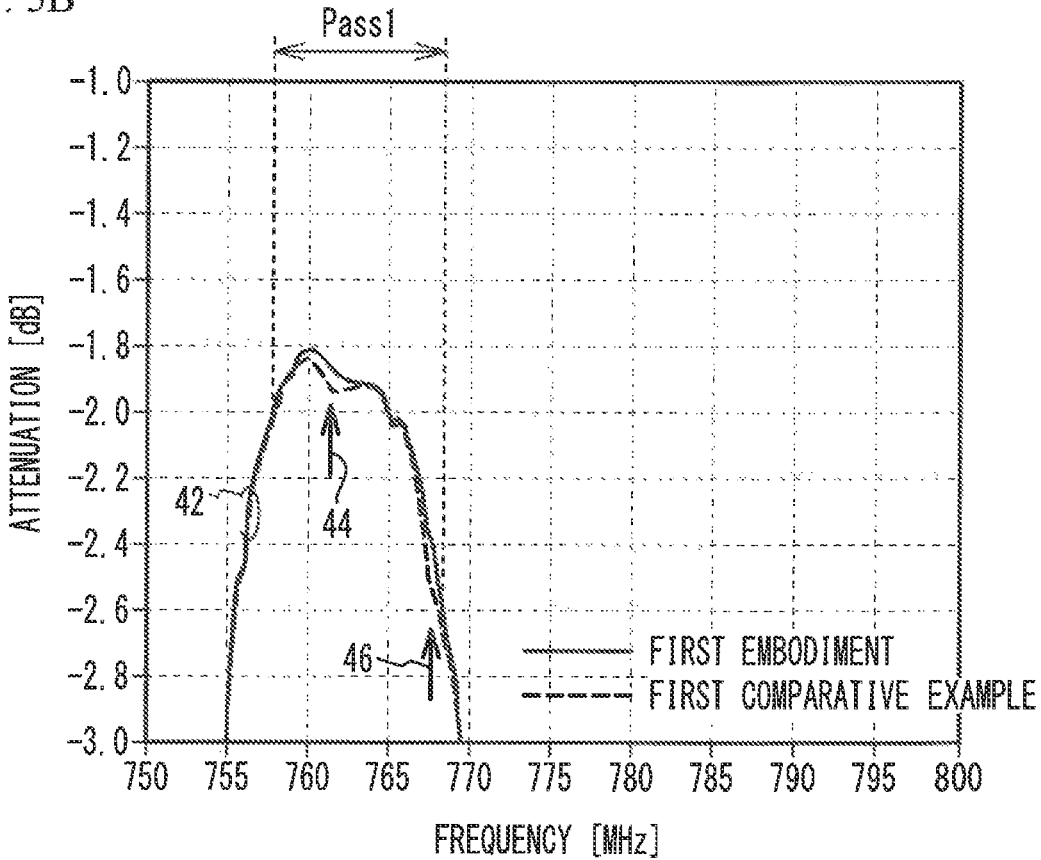

FIG. 5A and FIG. 5B illustrate transmission characteristics of the filters 40 and 42 in the first embodiment and the first comparative example. FIG. 5A illustrates the transmission characteristics of the filters 40 and 42, and FIG. 5B illustrates the transmission characteristic of the filter 42. The transmission characteristic of the filter 40 is the transmission characteristic between the common terminal Ant and the terminal T2, and the transmission characteristic of the filter 42 is the transmission characteristic between the common terminal Ant and the terminal T1. The simulation results of the first embodiment are indicated by solid lines, and the simulation results of the first comparative example are indicated by dashed lines.

As illustrated in FIG. 5A, the passband Pass1 of the filter 42 is from 758 MHz to 768 MHz, and the passband Pass2 of the filter 40 is from 788 MHz to 798 MHz. As illustrated in FIG. 5B, at approximately 761 MHz indicated by an arrow 44 and approximately 768 MHz indicated by an arrow 46, the loss of the first comparative example is greater than that of the first embodiment.

Figure 6A:
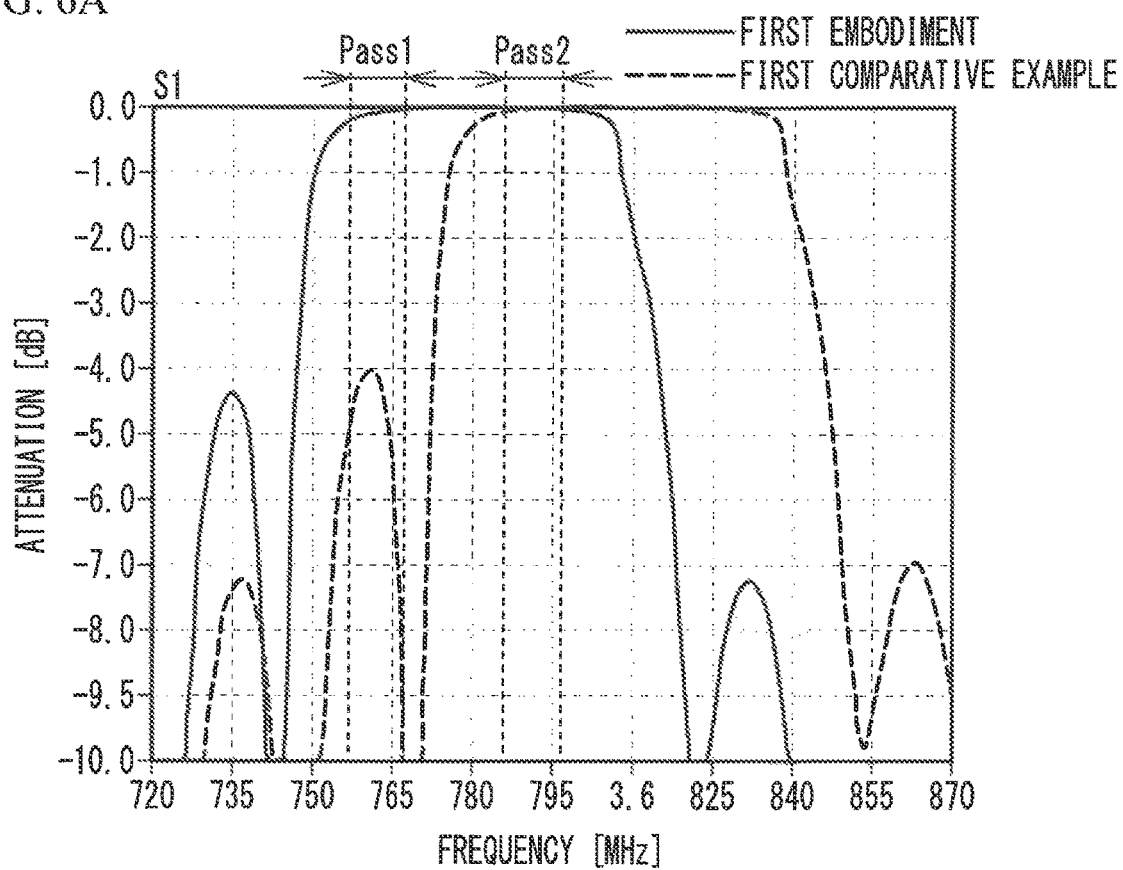
FIG. 6A and FIG. 6B illustrate reflection characteristics of reflectors in the first embodiment and the first comparative example.
Figure 6B:
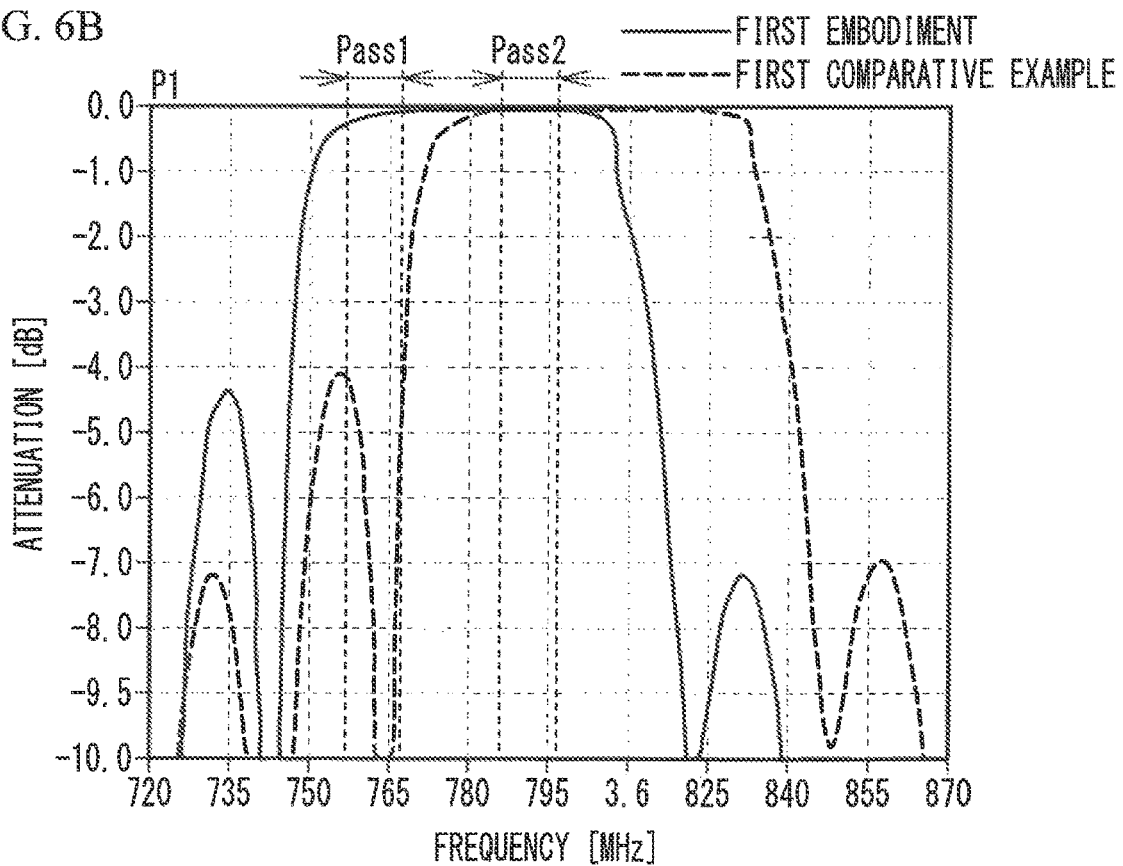

FIG. 6A and FIG. 6B illustrate reflection characteristics of the reflectors in the first embodiment and the first comparative example. FIG. 6A illustrates the reflection characteristic of the reflector 20 of the series resonator S1, and FIG. 6B illustrates the reflection characteristic of the reflector 20 of the parallel resonator P1. The frequency band in which the reflection is around 0 dB is the stopband.

As illustrated in FIG. 6A, in the first comparative example, the stopband of the reflector 20 of the series resonator S1 includes the passband Pass2 of the filter 40, but does not include the passband Pass1 of the filter 42. In the first embodiment, the stopband of the reflector 20 of the series resonator S1 includes both the passbands Pass1 and Pass2.

As illustrated in FIG. 6B, in the first comparative example, the stopband of the reflector 20 of the parallel resonator P1 includes the passband Pass2 of the filter 40, but does not include the passband Pass1 of the filter 42. In the first embodiment, the stopband of the reflector 20 of the parallel resonator P1 includes both the passbands Pass1 and Pass2.

As seen above, in the first embodiment, each of the stopbands of the reflectors 20 of the series resonator S1 and the parallel resonator P1 includes the passband of the filter 42.

Figure 7A:
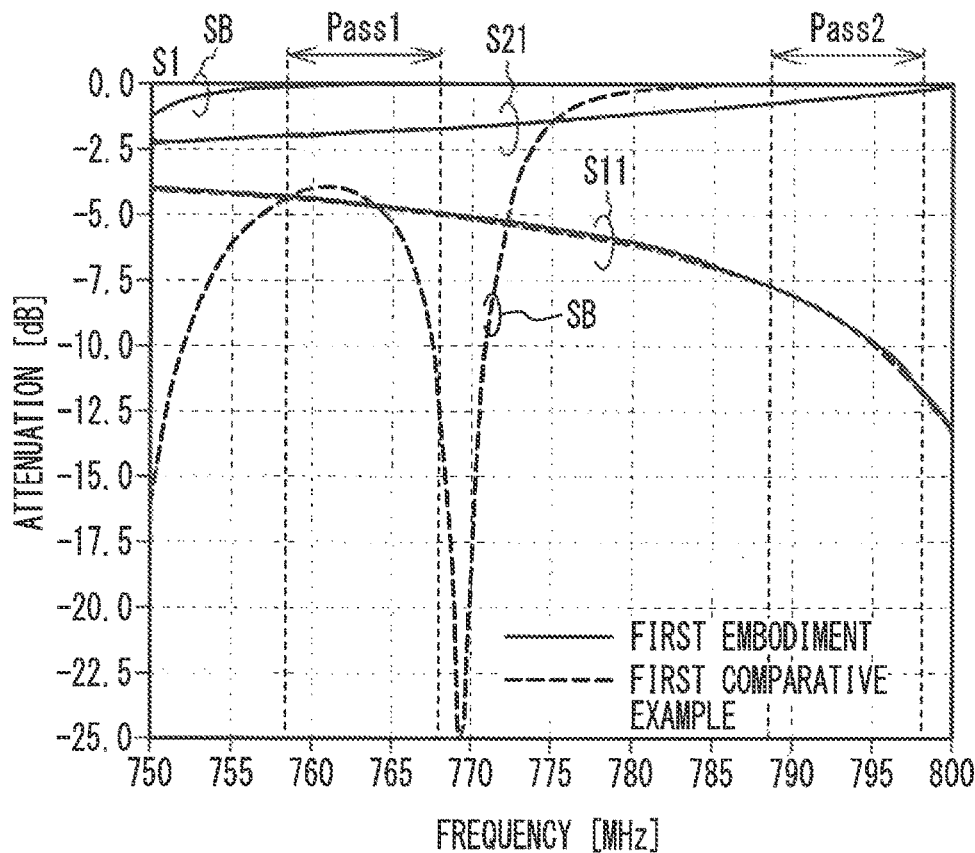
FIG. 7A and FIG. 7B illustrate transmission characteristics of resonators and reflection characteristics of reflectors in the first embodiment and the first comparative example.
Figure 7B:
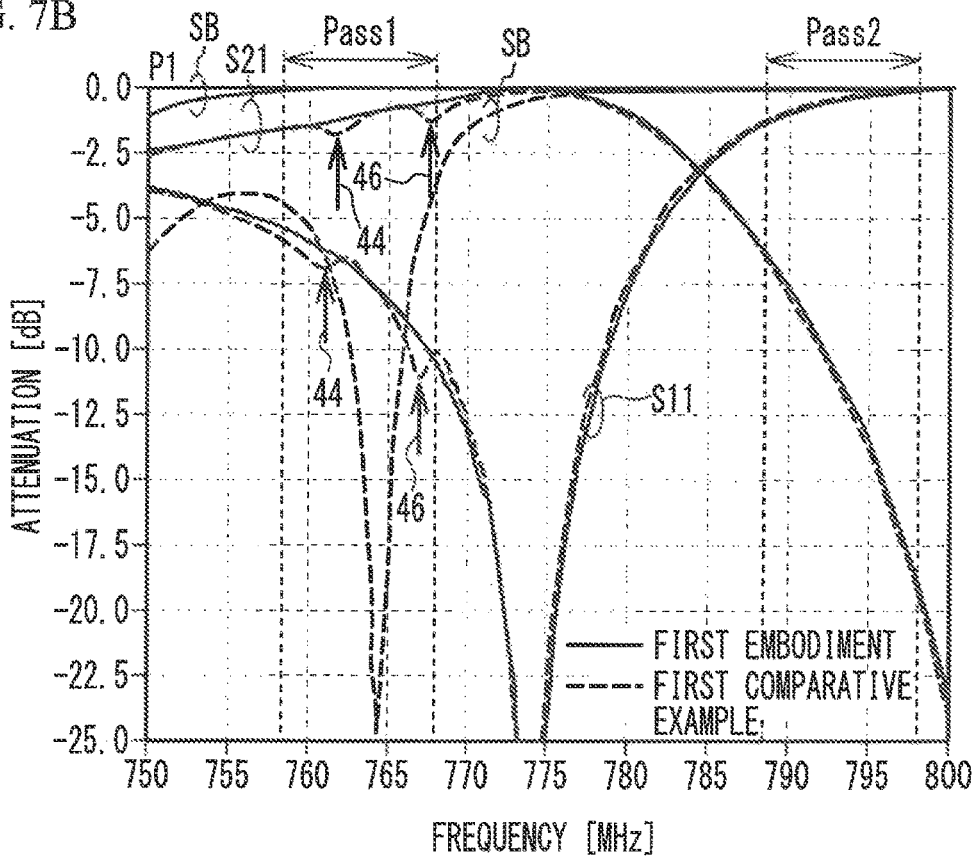

FIG. 7A and FIG. 7B illustrate transmission characteristics of the resonators and reflection characteristics of the reflectors in the first embodiment and the first comparative example. FIG. 7A illustrates the transmission characteristic (S21) and the reflection characteristic (S11) of the series resonator S1 and the reflection characteristic of the reflector 20 of the series resonator S1 in the filter 40. FIG. 7B illustrates the transmission characteristic (S21) and the reflection characteristics (S11) of the parallel resonator P1 and the reflection characteristic of the reflector 20 of the parallel resonator P1 in the filter 40. The transmission characteristic of the resonator is indicated by S21, the reflection characteristic of the resonator is indicated by S11, and the reflection characteristic of the reflector 20 is indicated by SB.

As illustrated in FIG. 7A and FIG. 7B, particularly in the parallel resonator P1, as indicated by the arrows 44 and 46, the transmission characteristic and the reflection characteristic decrease in the frequency band slightly lower than the stopband in the reflection characteristic SB of the reflector 20 in the first comparative example. The frequencies of the arrows 44 and 46 are substantially equal to the frequencies of the arrows 44 and 46 in FIG. 5B.

Summarizing, in the first comparative example, each of the stopbands of the reflectors 20 in the series resonator S1 and the parallel resonator P1 does not include the passband Pass1 of the filter 42. Thus, in the passband Pass1 of the filter 42, the reflection characteristics of the series resonator S1 and the parallel resonator P1 decrease. Thus, a part of the high-frequency signal to pass through the filter 42 passes through the filter 40, and thereby, the loss of the filter 42 increases.

It has been known that at the high-frequency end of the stopband, impedance rapidly varies, and affects the filter characteristics as described in Patent Document 1. However, it has not been known that when the low-frequency end of the stopband of the reflector 20 of the parallel resonator P1 and/or the series resonator S1 closest to the common terminal Ant of the filter 40 is located within the passband Pass1 of the filter 42, this affects the transmission characteristic of the filter 42.

In the first embodiment, when PR1 represents the average pitch of the grating bars 16 of the parallel resonator P1 closest to the common terminal Ant in terms of circuit connection among the parallel resonators P1 to P3 and PD1 represents the average pitch of the electrode fingers 14 of the parallel resonator P1 closest to the common terminal Ant in terms of circuit connection among the parallel resonators P1 to P3 in the filter 40 (a second filter) having the passband Pass2 higher than the passband Pass1 of the filter 42 (a first filter), PR1>PD1. This configuration makes the stopband of the reflector 20 of the parallel resonator P1 low Thus, the frequencies at which the reflection characteristic of the parallel resonator P1 decreases as indicated by the arrows 44 and 46 decrease to frequencies lower than the passband Pass1 of the filter 42. Therefore, the loss is reduced in the passband Pass1 of the filter 42.

The average pitch of the electrode fingers 14 can be calculated by dividing the width in the X direction of the IDT 24 by the number of the electrode fingers 14. The average pitch of the grating bars 16 can be calculated by dividing the width in the X direction of the reflector 20 by the number of the grating bars 16. It is more preferable that PR1≥1.01×PD1, and it is further preferable that PR1≥1.02×PD1. To cause the stopband of the reflector 20 to include the passband Pass2, it is preferable that PR1≤1.2×PD1, and it is more preferable that PR1≤1.1×PD1.

When fap represents the antiresonant frequency of the parallel resonator P1, f1 represents the center frequency of the passband Pass1 of the filter 42, and f2 represents the center frequency of the passband of the filter 40, the configuration of 2×fap/(f1+f2)≤PR1/PD1 causes the stopband of the reflector 20 of the parallel resonator P1 to include the passband Pass1. Thus, the loss is reduced in the passband Pass1 of the filter 42. For example, in the simulated parallel resonator of the first embodiment, fap=803 MHz, f1=763 MHz, f2=793 MHz, 2×fap/(f1+f2)=1.0321, and PR1/PD1=1.0324. Since the stopband of the reflector 20 includes the passband Pass2, it is preferable that 1.2×2×fap/(f1+f2) PR1/PD1, and it is more preferable that 1.1×2×fap/(f1+f2) ≥PR1/PD1.

The passband Pass1 of the filter 42 is the frequency band (the transmit band or the receive band) of the communication band. Signals in the frequency band (the transmit band or the receive band) of the communication band are transmitted by the filter 42. The passband Pass2 of the filter 40 is the frequency band (the transmit band and the receive band) of the communication band. Signals in the frequency band (the transmit band and the receive band) of the communication band are transmitted by the filter 40. The stopband can be calculated by simulation. For example, the band in which the reflection characteristic (the magnitude of S11) is equal to or greater than −1 dB is defined as the stopband.

Also in the parallel resonators P2 and P3, the average pitch PR2 of the grating bars 16 may be configured to be greater than the average pitch PD2 of the electrode fingers 14 as in the parallel resonator P1 This configuration inhibits the characteristic degradations indicated by the arrows 44 and 46 of the parallel resonators P2 and P3 in the passband Pass1. However, the resonator that greatly affects the transmission characteristic of the filter 42 is the parallel resonator P1 closest to the common terminal Ant. On the other hand, when the stopbands of the reflectors 20 of the parallel resonators P2 and P3 are configured to be as low as that of the parallel resonator P1, the characteristics of the filter 40 may deteriorate.

Thus, in at least one of the parallel resonators P2 and P3 other than the parallel resonator P1 among the parallel resonators P1 to P3, PR1/PD1>PR2/PD2 where PR2 represents the average pitch of the grating bars 16 and PD2 represents the average pitch of the electrode fingers 14. This configuration reduces the loss within the passband Pass1 of the filter 42, and inhibits the characteristic degradation of the filter 42. It is preferable that PR1/PD1>PR2/PD2 in all the parallel resonators P2 and P3.

In addition, in at least one of the parallel resonators P2 and P3, 2×fap2/(f1+f2)>PR2/PD2 where fap2 represents the antiresonant frequency. This configuration reduces the loss within the passband Pass1 of the filter 42, and inhibits the characteristic degradation of the filter 42. It is more preferable that 2×fap2/(f1+f2)>PR2/PD2 in all the parallel resonators P2 and P3.

When SR1 represents the average pitch of the grating bars 16 of the series resonator S1 closest to the common terminal Ant in terms of circuit connection among the series resonators S1 to S4, SD1 represents the average pitch of the electrode fingers 14 of the series resonator S1 closest to the common terminal Ant in terms of circuit connection, and fas represents the antiresonant frequency of the series resonator S1 closest to the common terminal Ant in terms of circuit connection, 2×fas/(f1+f2)≤SR1/SD1. This configuration causes the stopband of the reflector 20 of the series resonator S1 to include the passband Pass1. Thus, the loss is reduced in the passband Pass1 of the filter 42. For example, in the simulated series resonator S1 of the first embodiment, fap=836 MHz, f1=763 MHz, f2=793 MHz, 2×fap/(f1+f2)=1.0746, and SR1/SD1=1.0788. To cause the stopband of the reflector 20 to include the passband Pass2, it is preferable that 1.2×2×fas/(f1+f2)≥SR1/SD1, and it is more preferable that 1.1×2×fas/(f1+f2)≥SR1/SD1.

When SR2 represents the average pitch of the grating bars 16 and SD2 represents the average pitch of the electrode fingers 14 in at least one of the series resonators S2 to S4 other than the series resonator S1 among the series resonators S1 to S4, SR1/SD1>SR2/SD2. This configuration reduces the loss within the passband Pass1 of the filter 42, and inhibits the characteristic degradation of the filter 42. It is preferable that SR1/SD1>SR2/SD2 in all the series resonators S2 to S4.

In addition, in at least one of the series resonators S2 to S4, 2×fas2/(f1+f2)>SR2/SD2 where fas2 represents the antiresonant frequency. This configuration reduces the loss within the passband Pass1 of the filter 42, and inhibits the characteristic degradation of the filter 42. It is more preferable that 2×fast/(f1+f2)>SR2/SD2 in all the series resonators S1 to S4.

It is sufficient if the stopband of the reflector 20 includes the passband Pass1 in at least one of the series resonator S1 and the parallel resonator P1. The reflection characteristic of the resonator closest to the common terminal Ant affects the transmission characteristic of the filter 42. Thus, when the series resonator S1 is closest to the common terminal Ant in terms of circuit connection among the series resonators S1 to S4 and the parallel resonators P1 to P3, i.e., when the series resonator S1 has a pathway connecting to the common terminal Ant through none of the parallel resonators P1 to P3 and the series resonators S2 to S4 other than the series resonator S1 of the series resonators S1 to S4, it is preferable that the stopband of the series resonator S1 includes the passband Pass1. This configuration reduces the loss of the filter 42.

First Variation of the First Embodiment

Figure 8:
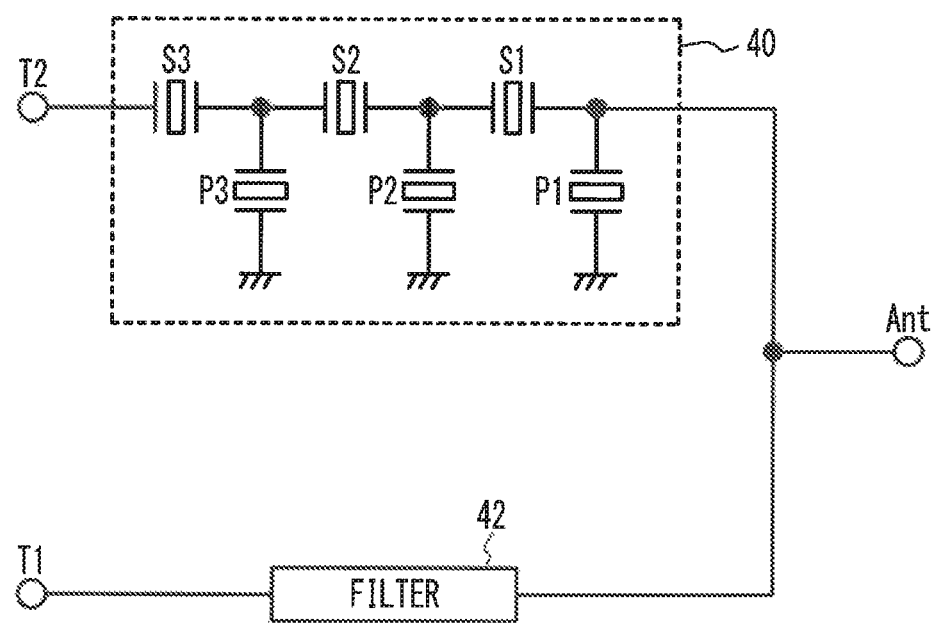
FIG. 8 is a circuit diagram of a multiplexer in accordance with a first variation of the first embodiment.

FIG. 8 is a circuit diagram of a multiplexer in accordance with a first variation of the first embodiment. As illustrated in FIG. 8, the filter 40 includes the series resonators S1 to S3 and the parallel resonators P1 to P3. The resonator closest to the common terminal Ant is the parallel resonator P1. Other configurations are the same as those of the first embodiment, and the description thereof is thus omitted.

As in the first variation of the first embodiment, when the parallel resonator P1 is closest to the common terminal Ant in terms of circuit connection among the series resonators S1 to S3 and the parallel resonators P1 to P3, i.e., when the parallel resonator P1 closest to the common terminal Ant in terms of circuit connection has a pathway connecting to the common terminal Ant through none of the series resonators S1 to S4 and the parallel resonators P2 and P3 other than the parallel resonator P1 of the parallel resonators P1 to P3, it is preferable that the stopband of the parallel resonator P1 includes the passband Pass1. This configuration reduces the loss of the filter 42.

In the first embodiment and the variations thereof, the number of series resonators and the number of parallel resonators in the filter 40 can be freely selected. The filter 42 may include the multimode type filter, or the filter 42 may be a ladder-type filter. The duplexer has been described as an example of the multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. A multiplexer comprising:
a first filter connected between a common terminal and a first terminal; and
a second filter connected between the common terminal and a second terminal, a passband of the second filter being higher than a passband of the first filter, the second filter including series resonators connected in series between the common terminal and the second terminal and parallel resonators connected in parallel between the common terminal and the second terminal, each of the series resonators including a pair of comb-shaped electrodes and a pair of reflectors, the pair of comb-shaped electrodes including electrode fingers, the pair of reflectors sandwiching the pair of comb-shaped electrodes therebetween and including grating bars, a stopband of the reflector of a series resonator closest to the common terminal in terms of circuit connection among the series resonators including the passband of the first filter and the passband of the second filter.

2. A multiplexer comprising:
a first filter connected between a common terminal and a first terminal; and
a second filter connected between the common terminal and a second terminal, a passband of the second filter being higher than a passband of the first filter, the second filter including series resonators connected in series between the common terminal and the second terminal and parallel resonators connected in parallel between the common terminal and the second terminal, each of the parallel resonators including a pair of comb-shaped electrodes and a pair of reflectors, the pair of comb-shaped electrodes including electrode fingers, the pair of reflectors sandwiching the pair of comb-shaped electrodes therebetween and including grating bars, PR1>PD1 where PR1 represents an average pitch of the grating bars of a parallel resonator closest to the common terminal in terms of circuit connection among the parallel resonators and PD1 represents an average pitch of the electrode fingers of the parallel resonator closest to the common terminal in terms of circuit connection,
wherein
when fap represents an antiresonant frequency of the parallel resonator closest to the common terminal in terms of circuit connection, f1 represents a center frequency of the passband of the first filter, and f2 represents a center frequency of the passband of the second filter, $2 \times \text{fap}/(f1+f2) \leq PR1/PD1$.

3. The multiplexer according to claim 2, wherein
when PR2 represents an average pitch of the grating bars in at least one parallel resonator other than the parallel resonator closest to the common terminal in terms of circuit connection among the parallel resonators and PD2 represents an average pitch of the electrode fingers in the at least one parallel resonator other than the parallel resonator closest to the common terminal in terms of circuit connection among the parallel resonators, $PR1/PD1 > PR2/PD2$.

4. The multiplexer according to claim 2, wherein
each of the series resonators includes a pair of comb-shaped electrodes and a pair of reflectors, the pair of comb-shaped electrodes including electrode fingers, the pair of reflectors sandwiching the pair of comb-shaped electrodes therebetween and including grating bars, and
when SR1 represents an average pitch of the grating bars of a series resonator closest to the common terminal in terms of circuit connection among the series resonators, SD1 represents an average pitch of the electrode fingers of the series resonator closest to the common terminal in terms of circuit connection, fas represents an antiresonant frequency of the series resonator closest to the common terminal in terms of circuit connection, f1 represents a center frequency of the passband of the first filter, and f2 represents a center frequency of the passband of the second filter, $2 \times \text{fas}/(f1+f2) \leq SR1/SD1$.

5. The multiplexer according to claim 2, wherein
the parallel resonator closest to the common terminal in terms of circuit connection has a pathway connecting to the common terminal through none of the series resonators and a parallel resonator other than the parallel resonator closest to the common terminal in terms of circuit connection of the parallel resonators.

6. A multiplexer comprising:

a first filter connected between a common terminal and a first terminal; and a second filter connected between the common terminal and a second terminal, a passband of the second filter being higher than a passband of the first filter, the second filter including series resonators connected in series between the common terminal and the second terminal and parallel resonators connected in parallel between the common terminal and the second terminal, each of the series resonators including a pair of comb-shaped electrodes and a pair of reflectors, the pair of comb-shaped electrodes including electrode fingers, the pair of reflectors sandwiching the pair of comb-shaped electrodes therebetween and including grating bars, $2 \times fas/(f1+f2) \leq SR1/SD1$ where SR1 represents an average pitch of the grating bars of a series resonator closest to the common terminal in terms of circuit connection among the series resonators, SD1 represents an average pitch of the electrode fingers of the series resonator closest to the common terminal in terms of circuit connection, fas represents an antiresonant frequency of the series resonator closest to the common terminal in terms of circuit connection, f1 represents a center frequency of the passband of the first filter, and f2 represents a center frequency of the passband of the second filter.

7. The multiplexer according to claim 6, wherein when SR2 represents an average pitch of the grating bars in at least one series resonator other than the series resonator closest to the common terminal in terms of circuit connection among the series resonators and SD2 represents an average pitch of the electrode fingers in at least one series resonator other than the series resonator closest to the common terminal in terms of circuit connection among the series resonators, $SR1/SD1 > SR2/SD2$.

8. The multiplexer according to claim 6, wherein the series resonator closest to the common terminal in terms of circuit connection has a pathway connecting to the common terminal through none of the parallel resonators and a series resonator other than the series resonator closest to the common terminal in terms of circuit connection of the series resonators.

* * * * *